US006876544B2

(12) United States Patent
Hsin

(10) Patent No.: US 6,876,544 B2
(45) Date of Patent: Apr. 5, 2005

(54) IMAGE SENSOR MODULE AND METHOD FOR MANUFACTURING THE SAME

(75) Inventor: Chung Hsien Hsin, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 74 days.

(21) Appl. No.: 10/621,962

(22) Filed: Jul. 16, 2003

(65) Prior Publication Data

US 2005/0013097 A1 Jan. 20, 2005

(51) Int. Cl.$^7$ ................................................ H05K 7/00
(52) U.S. Cl. ..................... 361/679; 257/668; 438/126; 361/695
(58) Field of Search ................................. 361/679–687, 361/724–727, 695; 257/666, 668, 678, 680, 692–696; 438/64, 126; 384/294, 307

(56) References Cited

U.S. PATENT DOCUMENTS

| | | | | |
|---|---|---|---|---|
| 6,747,261 B1 | * | 6/2004 | Hsieh et al. | ............. 250/208.1 |
| 6,816,198 B1 | * | 11/2004 | Suzuki | ........................ 348/294 |
| 2004/0113049 A1 | * | 6/2004 | Hsieh et al. | ............. 250/208.1 |
| 2004/0140420 A1 | * | 7/2004 | Dai et al. | ............... 250/214 R |

\* cited by examiner

*Primary Examiner*—Hung Van Duong
(74) *Attorney, Agent, or Firm*—Pro-Techtor International Services

(57) ABSTRACT

An image sensor module and a method for manufacturing the same. The image sensor module includes a substrate, a photosensitive chip mounted to the substrate, a plurality of wires for electrically connecting the photosensitive chip to the substrate, a frame layer mounted to the substrate to surround the photosensitive chip, and a lens barrel formed with a chamber at a center thereof and an external thread at an outer edge thereof. An inner edge of the frame layer is formed with an internal thread, and a transparent layer is fixed by the frame layer such that the photosensitive chip may receive optical signals passing through the transparent layer. The external thread is screwed to the internal thread of the frame layer. The lens barrel has a through hole and an aspheric lens from top to bottom.

8 Claims, 2 Drawing Sheets

IMAGE SENSOR MODULE AND METHOD FOR MANUFACTURING THE SAME

BACKGROUND OF THE INVENTION

1. Field of the Invention

The invention relates to an image sensor module and a method for manufacturing the same, and more particularly to an image sensor module in which may be conveniently manufactured with reduced manufacturing costs.

2. Description of the Related Art

A general sensor is used to sense signals, which may be optical or audio signals. The sensor of the invention is used to receive image signals or optical signals. After receiving the image signals, the sensor converts the image signals into electrical signals, which are then transmitted to a printed circuit board via a substrate.

Referring to FIG. 1, a conventional image sensor module includes a substrate 10, a frame layer 12, a photosensitive chip 14, a plurality of wires 15, a transparent layer 22, a lens holder 26, and a lens barrel 30. The substrate 10 has an upper surface 11 formed with signal input terminals 18, and a lower surface 13 formed with signal output terminals 24, which are electrically connected to a printed circuit board 19. The frame layer 12 is arranged on the substrate 10 to form a cavity 16 together with the substrate 10. The photosensitive chip 14 is arranged within the cavity 16 formed by the substrate 10 and the frame layer 12, and is formed with a plurality of bonding pads 20. The wires 15 electrically connect the bonding pads 20 of the photosensitive chip 14 to the signal input terminals 18 of the substrate 10. The transparent layer 22 is adhered to the frame layer 12 in order to cover the photosensitive chip 14, and an image sensor is thus formed. The lens holder 26 formed with an internal thread 28 is electrically connected to the printed circuit board 19 to cover the image sensor. The lens barrel 30 is formed with an external thread 32 that can be screwed to the internal thread 28 of the lens holder 26. The lens barrel 30 has a through hole 34, an aspheric lens 36 and an infrared filter 38 arranged from top to bottom.

However, the above-mentioned image sensor module has the following drawbacks.

1. When the image sensor is packaged, the frame layer 12 has to be mounted to the substrate 10, and then the chip mounting and wire bonding processes may be performed. When the wires 15 are bonded between the photosensitive chip 14 and the frame layer 12, the short distance will cause inconvenience in manufacturing.

2. During the manufacturing or transporting process of the transparent layer 22, particles are often attached to the periphery of the transparent layer 22. The particles may tend to fall into the image sensor and thus influence the image sensor quality. Consequently, the transparent layer 22 has to be chamfered to protect its periphery from particles or damage, thereby increasing the manufacturing cost and inconvenience in manufacturing.

3. Since the lens holder 26 has to be used for the combination with the lens barrel 30, the number of elements is greater, and the manufacturing cost is high.

SUMMARY OF THE INVENTION

An object of the invention is to provide an image sensor module and a method for manufacturing the same, which are capable of reducing the number of elements and the manufacturing cost.

Another object of the invention is to provide an image sensor module and a method for manufacturing the same, which may simplify the manufacturing processes and reduce the manufacturing cost.

Still another object of the invention is to provide an image sensor module capable of protecting the transparent layer from contamination and damage and facilitating the manufacturing processes accordingly.

To achieve the above-mentioned objects, the invention provides an image sensor module and a method for manufacturing the same. The image sensor module includes a substrate, a photosensitive chip mounted to the substrate, a plurality of wires for electrically connecting the photosensitive chip to the substrate, a frame layer mounted to the substrate to surround the photosensitive chip, and a lens barrel formed with a chamber at a center thereof and an external thread at an outer edge thereof. An inner edge of the frame layer is formed with an internal thread and a transparent layer is fixed by the frame layer such that the photosensitive chip may receive optical signals passing through the transparent layer. The external thread is screwed to the internal thread of the frame layer. The lens barrel has a through hole and an aspheric lens from top to bottom.

Utilizing the frame layer to clamp and fix the transparent layer and then mounting the frame layer to the substrate may easily achieve the objects and functions of the invention.

DETAILED DESCRIPTION OF THE INVENTION

Figure 1:
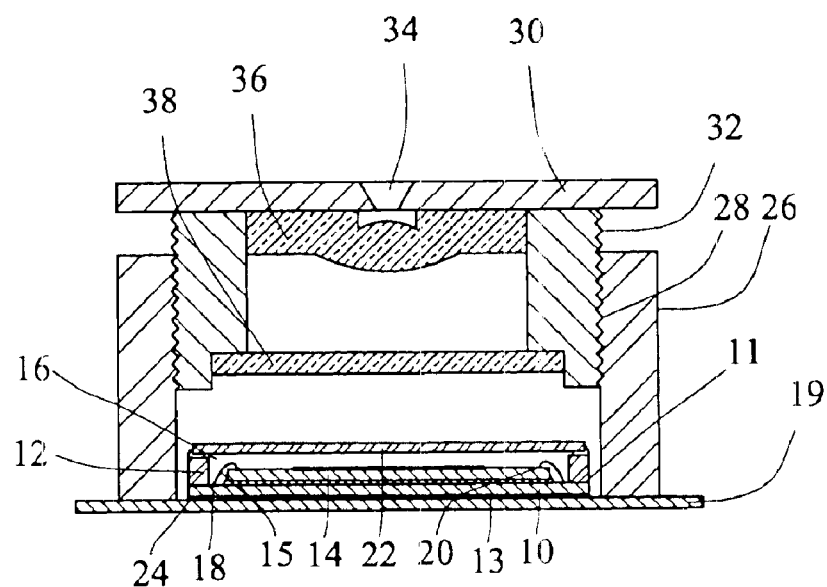
FIG. 1 is a schematic illustration showing a conventional image sensor module.
Figure 2:
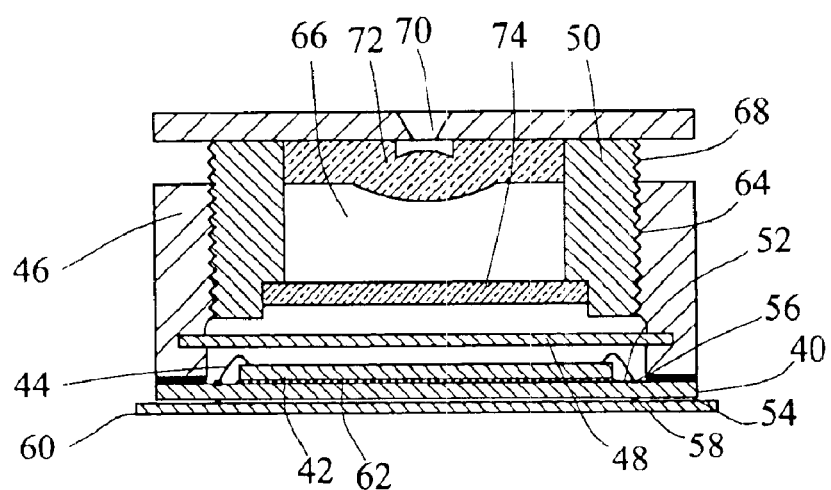
FIG. 2 is a cross-sectional view showing an image sensor module of the invention.

Referring to FIG. 2, an image sensor module of the invention includes a substrate 40, a photosensitive chip 42, a plurality of wires 44, a frame layer 46, a transparent layer 48, and a lens barrel 50.

The substrate 40 has an upper surface 52 formed with a plurality of first connection points 56, and a lower surface 54 formed with a plurality of second connection points 58, which is electrically connected to a printed circuit board 60.

The photosensitive chip 42 is adhered to the upper surface 52 of the substrate 40 by an adhesive 62.

The wires 44 electrically connect the photosensitive chip 42 to the first connection points 56 on the upper surface 52 of the substrate 40 in order to transfer signals from the photosensitive chip 42 to the substrate 40.

The frame layer 46 is mounted to the upper surface 52 of the substrate 40 to surround the photosensitive chip 42. An inner edge of the frame layer 46 is formed with an internal thread 64 from top to bottom, and the transparent layer 48 below the internal thread 64 is fixed by the frame layer 46 so that the photosensitive chip 42 may receive optical signals passing through the transparent layer 48.

In this embodiment, the frame layer 46 is formed of industrial plastic material by way of injection molding, the internal thread 64 is simultaneously formed, and the transparent layer 48 is simultaneously fixed, wherein the transparent layer 48 is a piece of transparent glass.

The lens barrel 50 is formed with a chamber 66 at a center thereof and an external thread 68 at an outer edge thereof. The external thread 68 may be screwed to the internal thread 64 of the frame layer 46. The lens barrel 50 has a through hole 70, an aspheric lens 72, and an infrared filter 74 from top to bottom.

Figure 3:
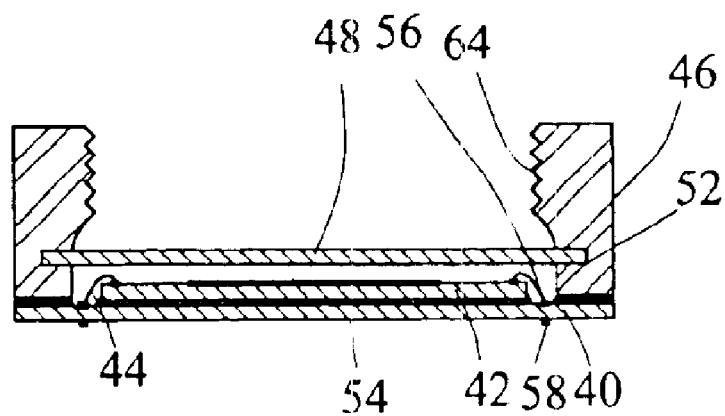
FIG. 3 is a first schematic illustration showing the image sensor module of the invention and a method for manufacturing the same.
Figure 4:
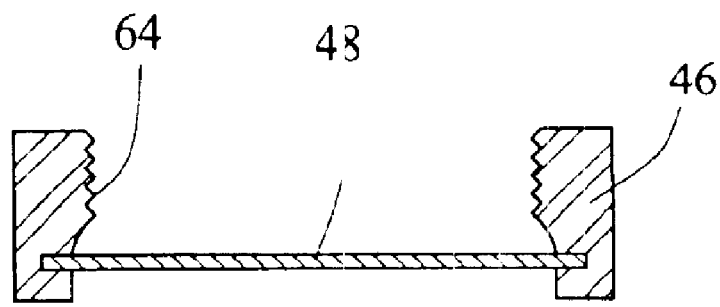
FIG. 4 is a second schematic illustration showing the image sensor module of the invention and a method for manufacturing the same.

Referring to FIGS. 3 and 4 in conjunction with FIG. 2, a method for manufacturing an image sensor module of the invention includes the steps of:

Providing a substrate 40 having an upper surface 52 formed with a plurality of first connection points 56, and a lower surface 54 formed with a plurality of second connection points 58, as shown in FIG. 3;

Mounting a photosensitive chip 42 to the upper surface 52 of the substrate 40, as shown in FIG. 3;

Providing a plurality of wires 44 to electrically connect the photosensitive chip 42 to the first connection points 56 on the upper surface 52 of the substrate 40, as shown in FIG. 3;

Mounting a frame layer 46 on the upper surface 52 of the substrate 40 to surround the photosensitive chip 42, wherein an inner edge of the frame layer 46 is formed with an internal thread 64 from top to bottom, and a transparent layer 48 is fixed by the frame layer 46 such that the photosensitive chip 42 may receive optical signals passing through the transparent layer 48, the frame layer 46 in this embodiment is formed of industrial plastic material by way of injection molding to simultaneously form the internal thread 64 and fix the transparent layer 48, which is a piece of transparent glass, as shown in FIG. 4; and Providing a lens barrel 50 formed with a chamber 66 at a center thereof and an external thread 68 at an outer edge thereof, wherein the external thread 68 may be screwed to the internal thread 64 of the frame layer 46, and the lens barrel 50 has a through hole 70, an aspheric lens 72, and an infrared filter 74 from top to bottom.

The invention has the following advantages.

1. Since the periphery of the transparent layer 48 is inserted into the frame layer 46, the periphery does not have to be chamfered. Thus, the manufacturing processes may be simplified, and the manufacturing cost may be reduced.

2. Since the periphery of the transparent layer 48 is free from being damaged, broken, or contaminated, the product quality may be effectively enhanced.

3. Since the frame layer 46 is mounted to the substrate 40 after the wires are bonded from the photosensitive chip 42 to the substrate 40, the wire bonding process may be simplified.

4. Forming the internal thread 64 in the frame layer 46 may replace the provision of the conventional lens holder. Thus, the number of elements may be reduced, the manufacturing processes may be simplified, and the manufacturing cost may be effectively reduced.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An image sensor module to be mounted to a printed circuit board, the image sensor module comprising:
  a substrate having an upper surface formed with a plurality of first connection points, and a lower surface formed with a plurality of second connection points, which is electrically connect to the printed circuit board;
  a photosensitive chip mounted to the upper surface of the substrate;
  a plurality of wires for electrically connecting the photosensitive chip to the first connection points on the upper surface of the substrate;
  a frame layer mounted to the upper surface of the substrate to surround the photosensitive chip, an inner edge of the frame layer being formed with an internal thread from top to bottom, and a transparent layer being fixed by the frame layer such that the photosensitive chip may receive optical signals passing through the transparent layer; and
  a lens barrel formed with a chamber at a center thereof and an external thread at an outer edge thereof, the external thread being screwed to the internal thread of the frame layer, wherein the lens barrel has a through hole and an aspheric lens from top to bottom.

2. The image sensor module according to claim 1, wherein the frame layer is made of industrial plastic material by way of injection molding to simultaneously form the internal thread and fix the transparent layer.

3. The image sensor module according to claim 1, wherein the transparent layer is a piece of transparent glass.

4. The image sensor module according to claim 1, wherein the lens barrel further has an infrared filter below the aspheric lens.

5. A method for manufacturing an image sensor module, comprising the steps of:
  providing a substrate having an upper surface formed with a plurality of first connection points, and a lower surface formed with a plurality of second connection points, which is electrically connect to the printed circuit board;
  mounting a photosensitive chip to the upper surface of the substrate;
  providing a plurality of wires for electrically connecting the photosensitive chip to the first connection points on the upper surface of the substrate;
  mounting a frame layer to the upper surface of the substrate so as to surround the photosensitive chip, wherein an inner edge of the frame layer is formed with an internal thread from top to bottom, and a transparent layer is fixed by the frame layer such that the photosensitive chip may receive optical signals passing through the transparent layer; and
  providing a lens barrel formed with a chamber at a center thereof and an external thread at an outer edge thereof, the external thread being screwed to the internal thread of the frame layer, wherein the lens barrel has a through hole and an aspheric lens from top to bottom.

6. The method according to claim 5, wherein the frame layer is made of industrial plastic material by way of injection molding to simultaneously form the internal thread and fix the transparent layer.

7. The method according to claim 5, wherein the transparent layer is a piece of transparent glass.

8. The method according to claim 5, wherein the lens barrel further has an infrared filter below the aspheric lens.

* * * * *